United States Patent
Luo

(10) Patent No.: US 10,326,105 B2
(45) Date of Patent: Jun. 18, 2019

(54) PACKAGING ASSEMBLY AND MANUFACTURING METHOD THEREOF

(71) Applicant: BOE TECHNOLOGY GROUP CO., LTD., Beijing (CN)

(72) Inventor: Chengyuan Luo, Beijing (CN)

(73) Assignee: BOE TECHNOOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/309,511

(22) PCT Filed: Feb. 23, 2016

(86) PCT No.: PCT/CN2016/074363
§ 371 (c)(1),
(2) Date: Nov. 8, 2016

(87) PCT Pub. No.: WO2016/138826
PCT Pub. Date: Sep. 9, 2016

(65) Prior Publication Data
US 2017/0194594 A1    Jul. 6, 2017

(30) Foreign Application Priority Data
Mar. 2, 2015    (CN) .......................... 2015 1 0093123

(51) Int. Cl.
*H01L 51/52* (2006.01)
*H01L 51/56* (2006.01)
*H01L 51/00* (2006.01)

(52) U.S. Cl.
CPC ........ *H01L 51/525* (2013.01); *H01L 51/5253* (2013.01); *H01L 51/56* (2013.01); *H01L 51/0097* (2013.01); *H01L 2251/5338* (2013.01)

(58) Field of Classification Search
CPC ........... H01L 51/525; H01L 2251/5338; H01L 51/56; H01L 51/5253
See application file for complete search history.

(56) References Cited

U.S. PATENT DOCUMENTS 6,952,078 B1 * 10/2005 Guenther .............. H01L 51/525
    313/506
7,135,352 B2 * 11/2006 Yokajty ................ H01L 51/524
    257/432

(Continued)

FOREIGN PATENT DOCUMENTS

CN    1612648 A    5/2005
CN    102449540 A    5/2012

(Continued)

OTHER PUBLICATIONS

International Search Report and Written Opinion for Application No. PCT/CN2016/074363, dated May 26, 2016, 12 Pages.

(Continued)

*Primary Examiner* — Jarrett J Stark
*Assistant Examiner* — Charles N Ausar-El
(74) *Attorney, Agent, or Firm* — Brooks Kushman P.C.

(57) ABSTRACT

The present disclosure provides a packaging assembly and a manufacturing method thereof. The packaging assembly comprising a first substrate, a second substrate arranged opposite to the first substrate, an electronic device located between the first substrate and the second substrate, a protective layer covering the electronic device, and a bonding layer for bonding the first substrate and the second substrate so as to realize surface-to-surface packaging. The packaging assembly further comprising an isolation layer located between the bonding layer and the protective layer and adhered to both them, wherein an adhesion force between the material for forming the isolation layer and that for forming the bonding layer is smaller than an adhesion force between the material for forming the protective layer and that for forming the bonding layer.

12 Claims, 2 Drawing Sheets

(56) References Cited

U.S. PATENT DOCUMENTS

| | | | | |
|---|---|---|---|---|
| 7,535,017 B2* | 5/2009 | Wittmann | | H01L 51/0097 |
| | | | | 257/40 |
| 9,431,618 B2* | 8/2016 | Kawata | | H01L 51/0097 |
| 9,666,834 B2* | 5/2017 | Kim | | H01L 51/5256 |
| 9,741,971 B2* | 8/2017 | Lee | | H01L 51/0097 |
| 9,825,254 B2* | 11/2017 | Wang | | H01L 51/5256 |
| 9,831,465 B2* | 11/2017 | Baisl | | H01L 51/448 |
| 2003/0064569 A1* | 4/2003 | Takayama | | H01L 21/76251 |
| | | | | 438/455 |
| 2005/0227387 A1* | 10/2005 | Yokajty | | H01L 51/524 |
| | | | | 438/22 |
| 2005/0248270 A1* | 11/2005 | Ghosh | | H01L 51/524 |
| | | | | 313/512 |
| 2007/0242055 A1* | 10/2007 | Lai | | G06F 3/0412 |
| | | | | 345/173 |
| 2010/0291391 A1* | 11/2010 | Okabe | | H01L 21/6835 |
| | | | | 428/411.1 |
| 2011/0100458 A1* | 5/2011 | Kang | | B32B 15/08 |
| | | | | 136/259 |
| 2011/0114992 A1* | 5/2011 | Schmid | | C23C 16/0272 |
| | | | | 257/100 |
| 2011/0241528 A1 | 10/2011 | Choi | | |
| 2012/0062823 A1 | 3/2012 | Takatani et al. | | |
| 2012/0107978 A1* | 5/2012 | Shin | | H01L 51/003 |
| | | | | 438/29 |
| 2012/0313137 A1* | 12/2012 | Shin | | H01L 51/5243 |
| | | | | 257/100 |
| 2014/0024180 A1* | 1/2014 | Choi | | H01L 21/02107 |
| | | | | 438/127 |
| 2014/0110685 A1* | 4/2014 | Hong | | C23C 14/042 |
| | | | | 257/40 |
| 2014/0179040 A1* | 6/2014 | Ramadas | | H05B 33/04 |
| | | | | 438/27 |
| 2014/0300529 A1* | 10/2014 | Kim | | H01L 27/326 |
| | | | | 345/80 |
| 2014/0346476 A1* | 11/2014 | Yao | | H01L 51/5259 |
| | | | | 257/40 |
| 2015/0144909 A1* | 5/2015 | Byun | | H01L 51/5253 |
| | | | | 257/40 |
| 2015/0280154 A1* | 10/2015 | Jang | | H01L 51/0097 |
| | | | | 257/40 |
| 2016/0248041 A1* | 8/2016 | Zeng | | H01L 51/56 |
| 2017/0084864 A1* | 3/2017 | Popp | | C08G 59/5033 |
| 2017/0186997 A1* | 6/2017 | Yoo | | B32B 7/12 |
| 2017/0213998 A1* | 7/2017 | Feng | | H01L 51/5253 |

FOREIGN PATENT DOCUMENTS

| | | |
|---|---|---|
| CN | 104037337 A | 9/2014 |
| CN | 104091890 A | 10/2014 |
| CN | 104658990 A | 5/2015 |

OTHER PUBLICATIONS

International Search Report and Written Opinion, English Translation.
CN102449540A, English Abstract and U.S. Equivalent.
CN104037337A, English Abstract.
CN104091890A, English Abstract.
CN104658990A, English Abstract.
CN1612648A, English Abstract.

* cited by examiner

PACKAGING ASSEMBLY AND MANUFACTURING METHOD THEREOF

CROSS-REFERENCE TO RELATED APPLICATIONS

This application is the U.S. national phase of PCT Application No. PCT/CN2016/074363 filed on Feb. 23, 2016, which claims priority to Chinese Patent Application No. 201510093123.9 filed on Mar. 2, 2015, the disclosures of which are incorporated in their entirety by reference herein.

TECHNICAL FIELD

The present disclosure relates to the field of electronic devices, in particular to a packaging assembly and a manufacturing method thereof.

BACKGROUND

An organic light-emitting diode (OLED) device will be corroded and damaged in local areas due to its contact with water and oxygen in use, thus it is very important to select a good packaging method for the OLED device.

At present, in the packaging technology for an OLED device, especially for a large-sized OLED device, resin adhesive is widely used for surface-to-surface packaging. Meanwhile, in order to enhance the effect of blocking water, oxygen and the like and to prevent the damage caused by direct contact of the resin adhesive with the OLED device, a passivation layer is added between the OLED device and the resin adhesive.

However, when moving the large-sized OLED device, it is unavoidable to bend the device. In the bending area, there is great difference in Young's modulus between the resin adhesive and the passivation layer, thus tangential pull stress will be generated among the layers, and cause the passivation layer to be peeled off the OLED device. Furthermore, when the passivation layer is a multi-layered structure, especially a structure consisting of stacked organic and inorganic layers, this pull stress will cause the layers constituting the passivation layer off each other, thereby affecting the packaging effect.

SUMMARY

An object of the present disclosure is to provide a packaging assembly capable of realizing better packaging effect for electronic devices than the prior arts, and a manufacturing method thereof.

In order to realize the object, the present disclosure provides solutions as follows.

An aspect according to the present disclosure provides a packaging assembly comprising:
 a first substrate;
 a second substrate arranged opposite to the first substrate;
 an electronic device located between the first substrate and the second substrate;
 a protective layer covering the electronic device; and
 a bonding layer for bonding the first substrate and the second substrate so as to realize surface-to-surface packaging;
 the packaging assembly further comprises an isolation layer located between the bonding layer and the protective layer and adhered to both of them, wherein an adhesion force between the material for forming the isolation layer and that for forming the bonding layer is smaller than an adhesion force between the material for forming the protective layer and that for forming the bonding layer.

According to one embodiment of the present disclosure, the packaging assembly is an OLED display panel, wherein the electronic device is an OLED device, the first substrate is an OLED coverplate, the second substrate is an OLED substrate, the protective layer is a passivation layer, the bonding layer is a packaging adhesive layer, and the OLED device and the OLED substrate are adhered together.

According to one embodiment of the present disclosure, the isolation layer is an arc-shaped structure.

Further, in the packaging assembly described above, there is a plurality of isolation layers distributed at intervals, and parts of the bonding layer and the protective layer, which are not isolated by the isolation layers, are adhered together.

According to one embodiment of the present disclosure, the interval between the isolation layers is not greater than 5 mm.

According to another embodiment of the present disclosure, the isolation layer is in the form of a round pattern of which the radius is 1 to 2 times the interval between the isolation layers.

Another aspect according to the present disclosure provides a manufacturing method of a packaging assembly, comprising a step of forming the packaging assembly, wherein the packaging assembly comprises:
 a first substrate;
 a second substrate arranged opposite to the first substrate;
 an electronic device located between the first substrate and the second substrate;
 a protective layer covering the electronic device; and
 a bonding layer for bonding the first substrate and the second substrate so as to realize surface-to-surface packaging;
 the packaging assembly further comprises an isolation layer located between the bonding layer and the protective layer and adhered to both of them, wherein an adhesion force between the material for forming the isolation layer and that for forming the bonding layer is smaller than an adhesion force between the material for forming the protective layer and that for forming the bonding layer.

According to one embodiment of the present disclosure, the packaging assembly is an OLED display panel, wherein the electronic device is an OLED device, the first substrate is an OLED coverplate, the second substrate is an OLED substrate, the protective layer is a passivation layer, the bonding layer is a packaging adhesive layer, and the OLED device and the OLED substrate are adhered together.

According to one embodiment of the present disclosure, the isolation layer is an arc-shaped structure.

Further, in the packaging assembly described above, there is a plurality of isolation layers distributed at intervals, and parts of the bonding layer and the protective layer, which are not isolated by the isolation layers, are adhered together.

According to one embodiment of the present disclosure, the interval between the isolation layers is not greater than 5 mm.

According to another embodiment of the present disclosure, the isolation layer is in the form of a round pattern of which the radius is 1 to 2 times the interval between the isolation layers.

For the packaging assembly and the manufacturing method thereof according to embodiments of the present disclosure, at least the following advantageous effects are produced: since the adhesion force between the material for forming the isolation layer and that for forming the bonding layer is smaller than the adhesion force between the material for forming the protective layer and that for forming the bonding layer, when the packaging assembly is bent, tangential stress between the isolation layer and the bonding layer is smaller than tangential stress between the protective layer and the bonding layer when directly adhered together. Thus, due to the existence of the isolation layer in the present disclosure, the tangential stress between the isolation layer and the protective layer is smaller than the tangential stress between the protective layer and the bonding layer when directly adhered together. In comparison with the prior art where no isolation layer exists, the pull stress applied by the bonding layer to the protective layer is reduced in the present disclosure, thus reducing the possibility of peeling the protective layer off the electronic device or of damaging the electronic device when peeling the protective layer off the electronic device, and realizing a better packaging effect for the electronic device.

DETAILED DESCRIPTION

In order to make the object, technical solutions and advantages of the present disclosure more clear, the present disclosure will be described in detail in conjunction with drawings and specific embodiments below. The following embodiments are not intended to limit the scope of the present disclosure.

Figure 1A:
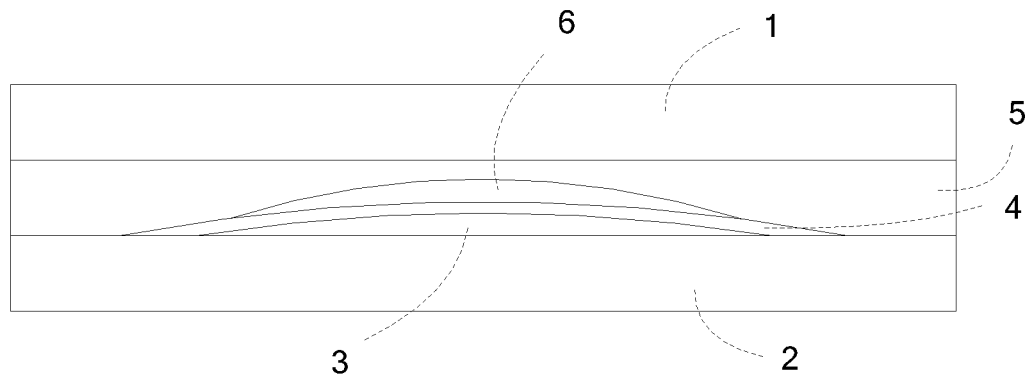
FIG. 1A is a schematic diagram showing a structure of a first packaging assembly according to one embodiment of the present disclosure.
Figure 1B:
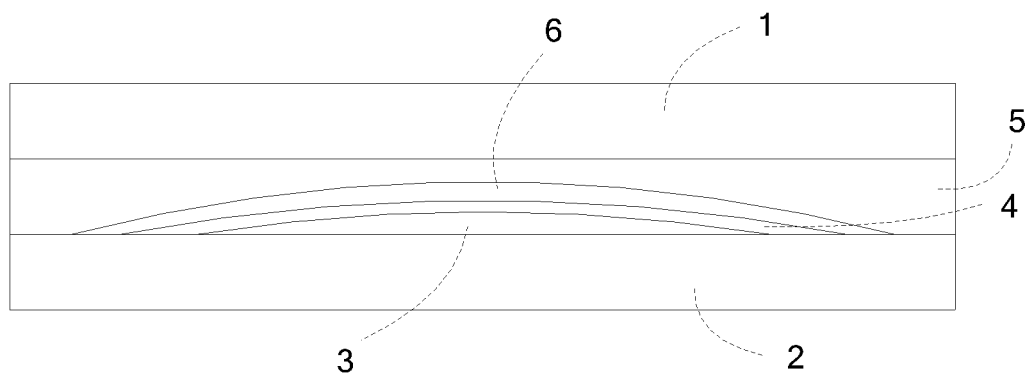
FIG. 1B is a schematic diagram showing a structure of a second packaging assembly according to one embodiment of the present disclosure.
Figure 1C:
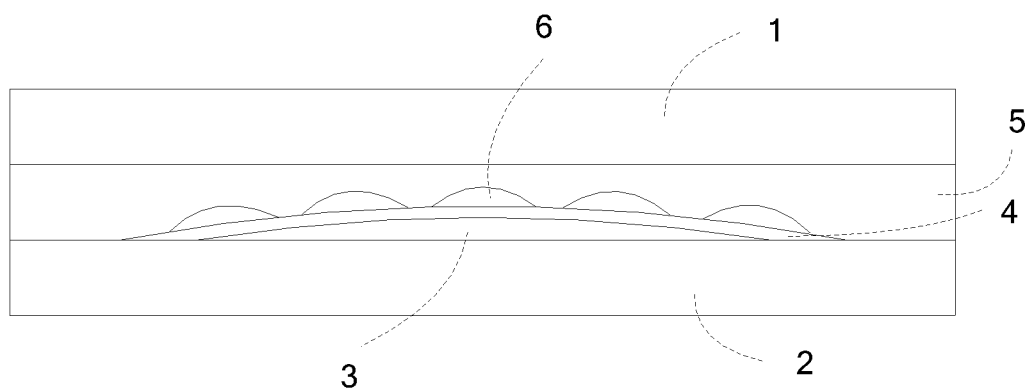
FIG. 1C is a schematic diagram showing a structure of a third packaging assembly according to one embodiment of the present disclosure.

FIGS. 1A, 1B and 1C are schematic diagrams showing structures of three packaging assemblies according to embodiments of the present disclosure. Referring to FIGS. 1A, 1B and 1C, the packaging assembly according to one embodiment of the present disclosure comprises:

a first substrate 1;

a second substrate 2 arranged opposite to the first substrate 1;

an electronic device 3 located between the first substrate 1 and the second substrate 2;

a protective layer 4 covering the electronic device 3; and a bonding layer 5 for bonding the first substrate 1 and the second substrate 2 so as to realize surface-to-surface packaging;

the packaging assembly further comprises an isolation layer 6 located between the bonding layer 5 and the protective layer 4 and adhered to both of them, wherein an adhesion force between the material for forming the isolation layer 6 and that for forming the bonding layer 5 is smaller than an adhesion force between the material for forming the protective layer 4 and that for forming the bonding layer 5.

Because the adhesion force between the material for forming the isolation layer and that for forming the bonding layer is smaller than the adhesion force between the material for forming the protective layer and that for forming the bonding layer, when the packaging assembly is bent, tangential stress between the isolation layer and the bonding layer is smaller than tangential stress between the protective layer and the bonding layer when directly adhered together. Thus, due to the existence of the isolation layer, the tangential stress between the isolation layer and the protective layer is smaller than the tangential stress between the protective layer and the bonding layer when directly adhered together. In comparison with the prior art where no isolation layer exists, the pull stress applied by the bonding layer to the protective layer is reduced in the present disclosure, thus reducing the possibility of peeling the protective layer off the electronic device or of damaging the electronic device when peeling the protective layer off the electronic device, and realizing a better packaging effect for the electronic device.

For the isolation layer 6, referring to the structures shown in FIGS. 1A and 1B, the number of the isolation layer 6 may be one. Or, referring to the structure shown in FIG. 1C, the number of the isolation layers 6 may be greater than one.

Furthermore, referring to the structures shown in FIGS. 1A and 1C, the isolation layer(s) 6 may partially isolate the protective layer 4 from the bonding layer 5. Or, referring to the structure shown in FIG. 1B, the isolation layer 6 may entirely isolate the protective layer 4 from the bonding layer 5.

Furthermore, the electronic device 3 may be, for example, a light-emitting diode (LED) device, an OLED device, or the like.

Typically, the packaging assembly may be an OLED display panel. Accordingly, in the packaging assembly, the electronic device 3 is an OLED device, the first substrate 1 is an OLED coverplate, the second substrate 2 is an OLED substrate, the protective layer 4 is a passivation layer for blocking water and oxygen, the bonding layer 5 is a packaging adhesive layer, and the OLED device and the OLED substrate are adhered together.

The passivation layer may be a single-layered structure or a multi-layered structure. The single-layered structure is usually an inorganic layer, and the multi-layered structure is usually formed by stacking inorganic layers and organic layers alternately. The inorganic layer may be formed of a material such as $SiN_x$, SiCN, $SiO_2$, SiNO or $Al_2O_3$. The organic layer may be formed of a polymer such as polyacrylate, polymethyl methacrylate (PMMA) or polycarbonate.

The isolation layer 6 may be formed of a material which can withstand a temperature of 150 degrees Celsius or higher and which has an adhesive force less than 0.05 N/cm with the packaging adhesive layer, such as polytetrafluoroethylene, paraffin, polyethylene, polypropylene or silicone oil.

The packaging adhesive layer may be formed of a material such as UV-curable resin adhesive or thermosetting resin adhesive.

When the OLED display panel is a flexible OLED display panel or a curved OLED display panel which is bent in a larger extent than the flexible OLED display panel, bending stress has greater negative impact on the peeling off among the packaging layers in the OLED display panel. In this case, the packaging assembly according to the present disclosure significantly reduces the possibility of the peeling off among the packaging layers in the OLED display panel, thereby significantly improving the mass production of large-sized OLED devices.

According to one embodiment of the present disclosure, the isolation layer 6 may be a prism structure. However, the prism structure has concentrated stress at its corners close to the protective layer, thus peeling-off among layers will be easily generated when it is bent to a certain degree.

In view of this, according to another embodiment of the present disclosure, the isolation layer 6 may be an arc-shaped structure, thereby preventing the peeling off caused by the concentration of pull stress between the isolation layer and the protective layer.

In addition, according to further another embodiment of the present disclosure, the isolation layer 6 may be in the form of a round pattern so as to make the stress in the edge where the isolation layer is adhered to the protective layer distributed more evenly and thus to avoid occurrence of the peeling off.

In a packaging assembly according to one embodiment of the present disclosure, referring to FIG. 1B, the isolation layer 6 may entirely isolate the protective layer 4 from the bonding layer 5. However, in the case where the isolation layer and the bonding layer are not closely adhered, they can be easily peeled from each other. Further, because the bonding layer 5 and the second substrate 2 are adhered in a small area, the packaging assembly will be easily cracked in the area where the bonding layer and the second substrate 2 are adhered. Moreover, in the structure illustrated in FIG. 1A, a similar problem will occur if the area of the pattern of the isolation layer 6 is too big.

In view of this, in order to make the packaging assembly have firm internal adhesion force, which will avoid the peeling off among layers and thus prevent the packaging assembly from cracking in the area where the bonding layer 5 and the second substrate 2 are adhered, the isolation layers 6 may be distributed at intervals and parts of the bonding layer 5 and the protective layer 4, which are not isolated by the isolation layers 6, may be adhered together, as shown in FIG. 1C.

Further, when the packaging assembly is an OLED display panel, the isolation layers 6 may be spaced apart at an interval not less than 2 mm. When the isolation layers are spaced apart at an interval less than 2 mm, the parts of the bonding layer 5 and the protective layer 4, which are not isolated cannot be adhered together.

On the other hand, when the parts of the bonding layer and the protective layer that are not isolated are too large, the peeling off may occur in corresponding parts of the protective layer and the electronic device, thereby easily resulting in the peeling of the protective layer off the electronic device and affecting the packaging effect.

In view of this, the interval between the isolation layers 6 is not greater than 5 mm.

In addition, when each of the isolation layers is in the form of a round pattern, the radius of the isolation layer 6 may be 1 to 2 times the interval between the isolation layers 6. As such, when the packaging assembly is an OLED display panel which is bent to a great degree, the peeling off among layers can also be effectively prevented.

Another aspect according to the present disclosure further provides a manufacturing method of a packaging assembly, comprising steps of forming the packaging assembly, wherein the packaging assembly comprises:
a first substrate;
a second substrate arranged opposite to the first substrate;
an electronic device located between the first substrate and the second substrate;
a protective layer covering the electronic device; and
a bonding layer for bonding the first substrate and the second substrate so as to realize surface-to-surface packaging;
the packaging assembly further comprises an isolation layer located between the bonding layer and the protective layer and adhered to both them, respectively, wherein an adhesion force between the material for forming the isolation layer and that for forming the bonding layer is smaller than an adhesion force between the material for forming the protective layer and that for forming the bonding layer.

Typically, the packaging assembly may be an OLED display panel, wherein the electronic device is an OLED device, the first substrate is an OLED coverplate, the second substrate is an OLED substrate, the protective layer is a passivation layer, the bonding layer is a packaging adhesive layer, and the OLED device and the OLED substrate are adhered together.

According to one embodiment of the present disclosure, the isolation layer may be an arc-shaped structure.

According to another embodiment of the present disclosure, there is a plurality of isolation layers distributed at intervals, and parts of the bonding layer and the protective layer, which are not isolated by the isolation layers, are adhered together.

According to one embodiment of the present disclosure, the interval between the isolation layers is not greater than 5 mm.

Further, the isolation layer may be in the form of a round pattern. When it is in the form of a round pattern, the radius of the isolation layer may be 1 to 2 times the interval between the isolation layers.

To illustrate the present disclosure more clearly, it will be described below in combination with specific embodiments.

In the packaging assembly according to the present disclosure, a patterned isolation layer is formed between the passivation layer and the packaging adhesive layer of a packaging structure of a traditional OLED device, thus stress generated when the OLED display panel is bent is released, thereby preventing the peeling off among the layers while ensuring the firmness of internal adhesion force of the device. The packaging assembly according to the present disclosure can be manufactured using a simple method and has a firm structure.

Typically, the packaging assembly according to the present disclosure comprises a passivation layer, an isolation layer, a packaging adhesive layer and a coverplate formed on the OLED device in sequence, thus pull stress between the packaging adhesive layer and the passivation layer when the OLED display panel is bent is reduced, which prevents the passivation layer from being peeled off the OLED device or damage to the OLED device when peeling the passivation layer off the OLED device, and thus ensures the packaging effect of the OLED device.

The peeling of the passivation layer off the OLED device or damage to the OLED device when peeling the passivation layer off the OLED device becomes worse in the flexible OLED display panel or a curved OLED display panel which is bent in a larger extent. Therefore, reducing the impact of the bending stress on the peeling off among the packaging layers of the OLED device is a key factor to the mass production of large-sized OLED devices.

Figure 2A:
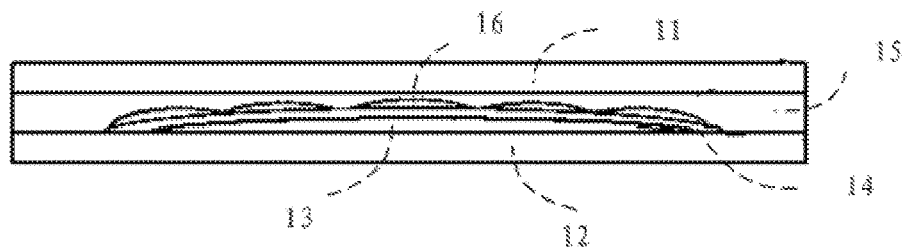
FIGS. 2A and 2B are schematic diagrams showing a normal state and a bending state of the packaging assembly according to one embodiment of the present disclosure, respectively.
Figure 2B:
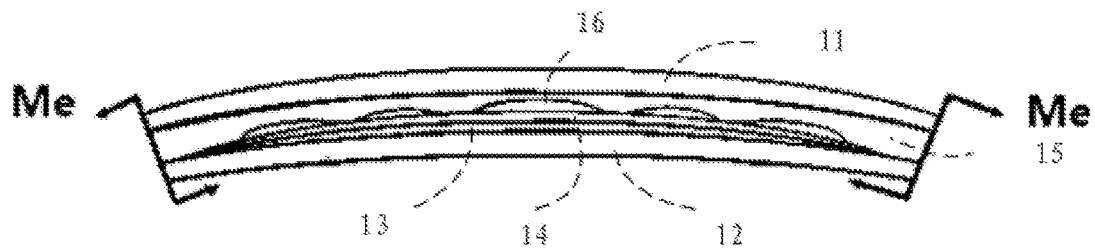

FIGS. 2A and 2B are schematic views showing a normal state and a bending state of a packaging assembly according to one embodiment of the present disclosure, respectively.

Referring to FIGS. 2A and 2B, this embodiment provides a packaging assembly which is a packaging structure for an OLED device, comprising: a passivation layer 14 formed on the OLED device 13 for blocking water and oxygen, a patterned isolation layer 16 formed on the passivation layer 14, and a packaging adhesive layer 15 formed on an OLED coverplate 11; the OLED coverplate 11 and the OLED substrate 12 are pressed together, which is followed by packaging and curing treatment. In the packaging assembly according to this embodiment, there is a small adhesion force between the isolation layer 16 and the packaging adhesive layer 15, thus friction between the isolation layer 16 and the packaging adhesive layer 15 is reduced, which results in a reduced pull stress between the packaging adhesive layer 15 and the passivation layer 14 when the OLED display panel is bent.

The passivation layer 14 may be a single-layered structure or a multi-layered structure. The single-layered structure is usually an inorganic layer, and the multi-layered structure is usually formed by stacking inorganic layers and organic layers alternately. The inorganic layer comprises $SiN_x$, SiCN, $SiO_2$, SiNO, $Al_2O_3$ or other materials. The inorganic layer may be formed by chemical vapor deposition (CVD), physical vapor deposition (PVD), atomic layer deposition (ALD), or the like. The organic layer comprises a polymer such as polyacrylate, polymethyl methacrylate (PMMA), or polycarbonate. The organic layer can be formed by splattering, spray-coating, screen printing, or the like.

The isolation layer 16 may be formed, for example, by coating a material which may withstand a temperature of 150 degrees Celsius or higher and may have an adhesive force less than 0.05 N/cm with the packaging adhesive layer. The material may be, for example, polytetrafluoroethylene, paraffin, polyethylene, polypropylene or silicone oil. The isolation layer 16 is in the form of a pattern, preferably a round pattern. In order to connect the passivation layer and the packaging adhesive layer in the pattern area and ensure firmness of the internal adhesion force of the packaging assembly, the patterns of the isolation layers are spaced apart at an interval between 2 mm and 5 mm. Besides, the radius of the round pattern of the isolation layer may be 1 to 2 times the interval between the patterns.

Figure 3:
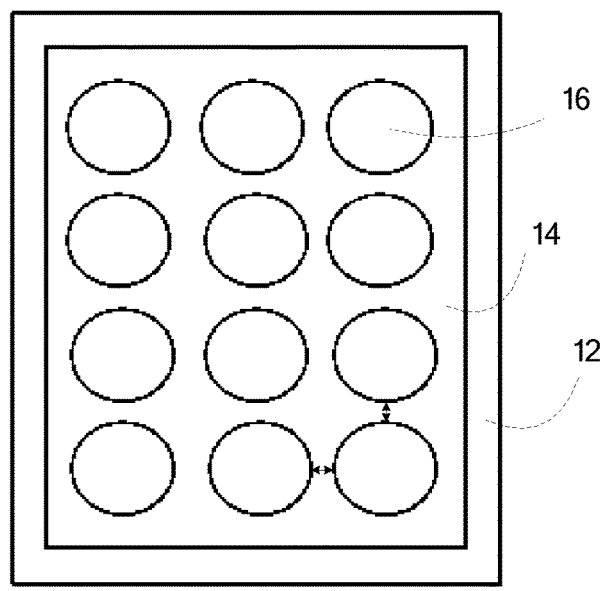
FIG. 3 is a top view of the pattern of the isolation layer of a packaging assembly according to one embodiment of the present disclosure.

FIG. 3 shows a structural relationship between the isolation layer and the passivation layer and the packaging adhesive layer when each of the isolation layers is in the form of a round pattern. As shown in FIG. 3, the isolation layers 16 are provided on the passivation layer 14 which covers the OLED device 13 arranged on the OLED substrate 12. The interval between the round patterns of the isolation layers 16 is shown by a line segment with arrows in FIG. 3.

The packaging adhesive layer 15 may be made of UV-curable resin adhesive or thermosetting resin adhesive. The UV-curable resin adhesive may comprises epoxy resin; or a light sensitive resin such as a homopolymer or copolymer of epoxypropyl acrylate, epoxypropyl methacrylate, methyl methacrylate, ethyl methacrylate, n-butyl methacrylate, 6,7-expoxyheptyl methacrylate, and 2-hydroxyethyl methacrylate. The thermosetting resin adhesive may include melamine-formaldehyde resin, unsaturated polyester resin, organic silicon resin, furan resin, or the like.

The OLED coverplate 11 may be made of glass, quartz, plastic or the like. The OLED substrate 12 may be also made of glass, quartz, plastic or the like. The OLED coverplate 11 and the OLED substrate 12 may be made of the same material or different material.

Examples of methods for manufacturing the packaging assembly of the present disclosure will be given below, wherein the packaging assembly is an OLED display panel.

EXAMPLE 1

A layer of $SiN_x$ having a thickness of 1 μm is prepared on the OLED device formed on a substrate by chemical vapor deposition to cover the entire light-emitting region. A mixture of polytetrafluoroethylene and paraffin is spray-coated on the $SiN_x$ layer to form isolation layers in the form of round patterns spaced apart at an interval of 3 mm and each having a diameter of 10 mm. A layer of UV-curable epoxy resin adhesive having a thickness of 20 μm is coated on a coverplate to act as a packaging adhesive layer. Then, the substrate and the coverplate are pressed together in vacuum so that the epoxy resin adhesive completely covers the mixture of polytetrafluoroethylene and paraffin. Finally, the packaging assembly is irradiated with UV light so that the packaging adhesive is cured.

EXAMPLE 2

A layer of $SiN_x$ having a thickness of 1 μm is prepared on the OLED device formed on a substrate by chemical vapor deposition to cover the entire light-emitting region. A layer of polyacrylate having a thickness of 0.5 μm is formed on the $SiN_x$ layer by spray-coating. A layer of SiCN having a thickness of 1 μm is prepared on the polyacryate layer by chemical vapor deposition. Then, polyethylene is spray-coated on the SiCN layer to form isolation layers in the form of round patterns each having a diameter of 5 mm and spaced apart at an interval of 2 mm. A layer of thermosetting epoxy resin adhesive having a thickness of 20 μm is coated on a coverplate to act as a packaging adhesive layer. Then, the substrate and the coverplate are pressed together in vacuum so that the epoxy resin adhesive completely covers the polyethylene layer. Finally, the packaging assembly is heated so that the packaging adhesive is cured.

EXAMPLE 3

A layer of $Al_2O_3$ having a thickness of 0.5 μm is prepared on an OLED device formed on a substrate by atomic layer deposition to cover the entire light-emitting region. Then, a layer of SiCN having a thickness of 1 μm is prepared on the $Al_2O_3$ layer by chemical vapor deposition. Then, polypropylene is spray-coated on the SiCN layer to form isolation layers in the form of round patterns each having a diameter of 5 mm and spaced apart at an interval of 2 mm. A layer of thermosetting epoxy resin adhesive having a thickness of 10 μm is coated on the coverplate to act as a packaging adhesive layer. Then, the substrate and the coverplate are pressed together in vacuum so that the epoxy resin adhesive completely covers the polypropylene layer. Finally, the packaging assembly is heated so that the packaging adhesive is cured.

The above are merely alternative embodiments of the present disclosure. It shall be indicated that a person skilled having ordinary skills in the art may make several improvements and modifications without departing from the principle of the present disclosure, and these improvements and modifications shall be deemed to be encompassed within the protection scope of the present disclosure.

What is claimed is:

1. A packaging assembly, comprising:
   a first substrate;

a second substrate arranged opposite to the first substrate;
an electronic device located between the first substrate and the second substrate;
a protective layer covering the electronic device;
a bonding layer for bonding the first substrate and the second substrate, wherein the bonding layer directly contacts a surface of the first substrate facing towards the second substrate and directly contacts a surface of the second substrate facing towards the first substrate; and
a plurality of isolation layers located between the bonding layer and the protective layer and adhered to both of the bonding layer and the protective layer,
wherein the plurality of isolation layers is distributed at intervals, and parts of the bonding layer and the protective layer not being isolated by the isolation layers are adhered together;
an adhesion force between a material for forming the plurality of isolation layers and a material for forming the bonding layer is smaller than an adhesion force between a material for forming the protective layer and the material for forming the bonding layer.

2. The packaging assembly according to claim 1, wherein the packaging assembly is an organic light-emitting diode (OLED) display panel.

3. The packaging assembly according to claim 2, wherein the electronic device is an OLED device, the first substrate is an OLED coverplate, the second substrate is an OLED substrate, the protective layer is a passivation layer, the bonding layer is a packaging adhesive layer, and the OLED device and the OLED substrate are adhered together.

4. The packaging assembly according to claim 1, wherein each of the isolation layers is an arc-shaped structure.

5. A packaging assembly, comprising:
a first substrate;
a second substrate arranged opposite to the first substrate;
an electronic device located between the first substrate and the second substrate;
a protective layer covering the electronic device;
a bonding layer for bonding the first substrate and the second substrate, wherein the bonding layer directly contacts a surface of the first substrate facing towards the second substrate and directly contacts a surface of the second substrate facing towards the first substrate; and
a plurality of isolation layers located between the bonding layer and the protective layer and adhered to both of the bonding layer and the protective layer,
wherein the plurality of isolation layers is distributed at intervals, and parts of the bonding layer and the protective layer not being isolated by the isolation layers are adhered together;
an adhesion force between a material for forming the plurality of isolation layers and a material for forming the bonding layer is smaller than an adhesion force between a material for forming the protective layer and the material for forming the bonding layer,
wherein the interval between the isolation layers is not greater than 5 mm.

6. The packaging assembly according to claim 5, wherein each of the isolation layers is in a form of a round pattern, a radius of which is 1 to 2 times of the interval between the isolation layers.

7. A method for manufacturing a packaging assembly, comprising a step of forming the packaging assembly,
wherein the packaging assembly comprises:
a first substrate;
a second substrate arranged opposite to the first substrate;
an electronic device located between the first substrate and the second substrate;
a protective layer covering the electronic device;
a bonding layer for bonding the first substrate and the second substrate, wherein the bonding layer directly contacts a surface of the first substrate facing towards the second substrate and directly contacts a surface of the second substrate facing towards the first substrate; and
a plurality of isolation layers located between the bonding layer and the protective layer and adhered to both of the bonding layer and the protective layer,
wherein the plurality of isolation layers is distributed at intervals, and parts of the bonding layer and the protective layer not being isolated by the isolation layers are adhered together; an adhesion force between a material for forming the plurality of isolation layers and a material for forming the bonding layer is smaller than an adhesion force between a material for forming the protective layer and the material for forming the bonding layer.

8. The manufacturing method according to claim 7, wherein the packaging assembly is an organic light-emitting diode (OLED) display panel.

9. The manufacturing method according to claim 8, wherein the electronic device is an OLED device, the first substrate is an OLED coverplate, the second substrate is an OLED substrate, the protective layer is a passivation layer, the bonding layer is a packaging adhesive layer, and the OLED device and the OLED substrate are adhered together.

10. The manufacturing method according to claim 7, wherein each of the isolation layers is an arc-shaped structure.

11. The manufacturing method according to claim 7, wherein the interval between the isolation layers is not greater than 5 mm.

12. The manufacturing method according to claim 11, wherein each of the isolation layers is in a form of a round pattern, a radius of which is 1 to 2 times of the interval between the isolation layers.

* * * * *